United States Patent [19]
Alexander et al.

[11] Patent Number: 5,189,261
[45] Date of Patent: Feb. 23, 1993

[54] ELECTRICAL AND/OR THERMAL INTERCONNECTIONS AND METHODS FOR OBTAINING SUCH

[75] Inventors: Lawrence C. Alexander, Whitney Point; Bernd K. Appelt, Apalachin, both of N.Y.; David K. Balkin, Mishawaka, Ind.; James J. Hansen, Endicott; Joseph Hromek, Endwell; Ronald A. Kaschak, Vestal; John M. Lauffer, Waverly; Irving Memis, Vestal; Magan S. Patel, Endicott; Andrew M. Seman, Kirkwood; Robin A. Susko, Owego, all of N.Y.

[73] Assignee: IBM Corporation, Armonk, N.Y.

[21] Appl. No.: 598,466

[22] Filed: Oct. 9, 1990

[51] Int. Cl.5 .............................. H05K 1/00
[52] U.S. Cl. ........................ 174/263; 29/846; 428/901
[58] Field of Search ............ 174/255, 262, 263, 264, 174/265, 266; 361/397, 414; 29/830, 846; 428/901; 439/66

[56] References Cited

U.S. PATENT DOCUMENTS

| | | | |
|---|---|---|---|
| 2,912,745 | 11/1959 | Steigerwalt et al. | 29/155.5 |
| 2,912,746 | 11/1959 | Oshry et al. | 29/155.5 |
| 3,268,652 | 8/1966 | Burns et al. | 174/68.5 |
| 3,346,950 | 10/1967 | Schick | 29/625 |
| 3,445,929 | 5/1969 | Wolf | 29/62.5 |
| 3,452,149 | 6/1969 | Rinaldi | 174/68.5 |
| 3,501,831 | 3/1970 | Gordon | 29/625 |
| 3,562,009 | 2/1971 | Cranston et al. | 117/227 |
| 3,649,806 | 3/1972 | Konig | 219/121 |
| 3,673,680 | 7/1972 | Tanaka | 29/626 |
| 3,674,914 | 7/1972 | Burr | 174/251 |
| 3,718,968 | 3/1973 | Sims et al. | 29/482 |
| 3,744,129 | 7/1973 | Dewey, Jr. | 29/624 |
| 3,880,486 | 4/1975 | Avakian | 339/17 |
| 3,971,610 | 7/1976 | Buchoff | 339/17 |
| 3,980,367 | 9/1976 | Laserson et al. | 339/17 |
| 4,097,684 | 6/1978 | Burr | 361/397 X |
| 4,121,044 | 10/1978 | Hadersbeck et al. | 174/68.5 |
| 4,323,593 | 4/1982 | Tsunashima | 427/97 |
| 4,338,506 | 7/1982 | Geller | 219/121 |
| 4,341,942 | 7/1982 | Chaudhari | 219/121 |
| 4,472,238 | 9/1984 | Johnson | 156/643 |
| 4,587,395 | 5/1986 | Oakley et al. | 219/121 |
| 4,700,473 | 10/1987 | Freyman | 29/830 X |
| 4,720,322 | 1/1988 | Tiffin | 156/643 |
| 4,729,061 | 3/1988 | Brown | 361/414 X |
| 4,747,211 | 5/1988 | Gilleo | 29/852 |
| 4,791,239 | 12/1988 | Shirahata | 174/262 X |
| 4,814,578 | 3/1989 | Tuckerman | 219/121.65 |
| 4,851,614 | 7/1989 | Duncan | 29/853 |
| 4,879,156 | 11/1989 | Herron et al. | 428/901 X |
| 4,888,450 | 12/1989 | Lando | 174/264 X |
| 4,935,584 | 6/1990 | Boggs | 174/262 |
| 4,972,050 | 11/1990 | Hammond | 174/261 X |

Primary Examiner—Leo P. Picard
Assistant Examiner—Trinidad Korka
Attorney, Agent, or Firm—Pollock Vande Sande and Priddy

[57] ABSTRACT

Circuit boards or cards containing metallic layers on opposite major surfaces of a dielectric substrate whereby electrical and/or thermal interconnection between the metallic layers is provided in vias that extend through one of the metallic layers, and the dielectric substrate and into the other metallic layer.

9 Claims, 3 Drawing Sheets

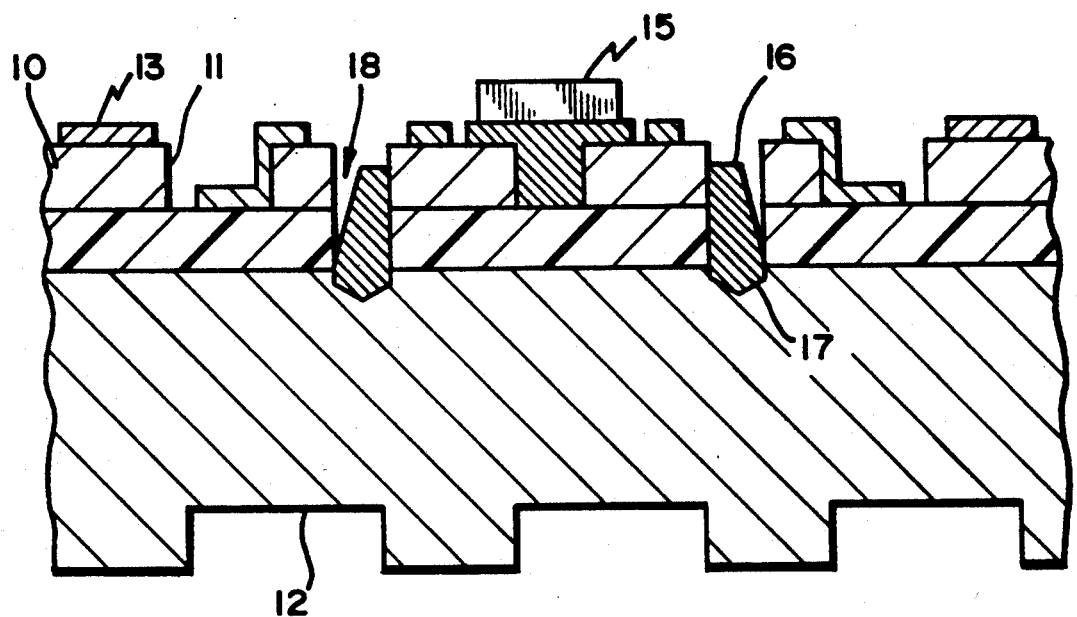
FIG_3
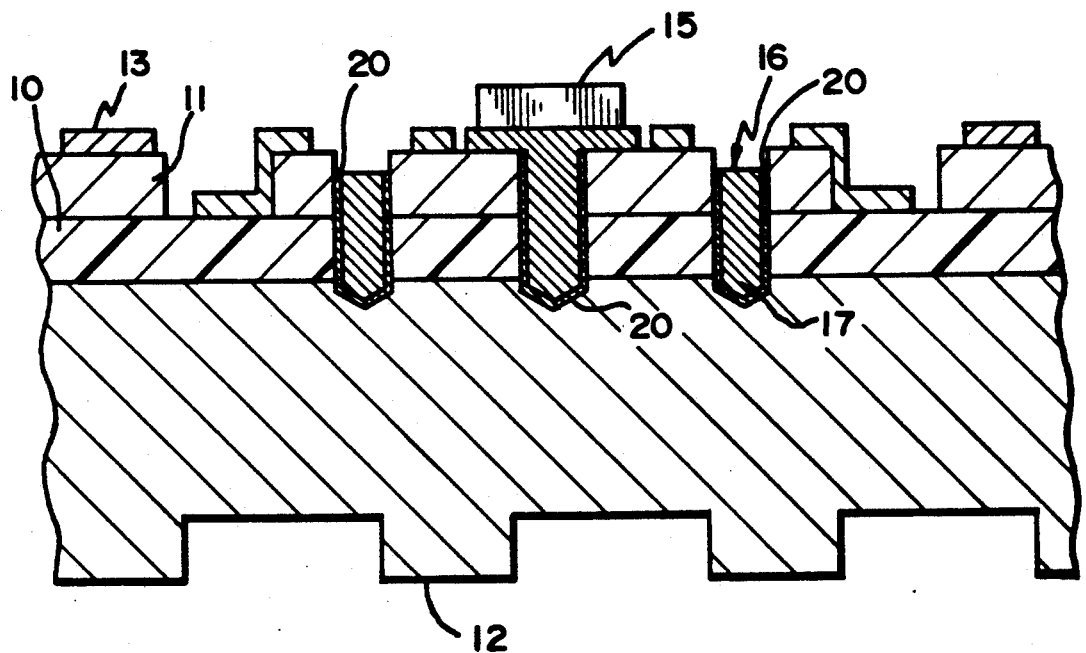
FIG_4

ELECTRICAL AND/OR THERMAL INTERCONNECTIONS AND METHODS FOR OBTAINING SUCH

DESCRIPTION

1. Technical Field

The present invention is concerned with providing electrical and/or thermal interconnection between metallic layers on different surfaces of a dielectric substrate employing vias. The present invention is especially concerned with providing circuit boards or circuit cards.

2. Background Art

In the fabrication of circuit cards or boards it is necessary to provide electrical interconnections between metallic layers on different or opposing surfaces of a dielectric substrate. The interconnections are important not only for electrical connection but also to provide for thermal dissipation. When integrated circuit chips are mounted on a card or board, the junction joining the chips to the card or board must not exceed a predetermined critical temperature during use in order to insure long term reliability and product life. Accordingly, thermal dissipation is necessary to insure that the chip junction temperature does not exceed a critical maximum value.

Presently, a widely used technique for achieving such electrical connection, is to provide vias having a metal plated on walls of the vias. However, plating is a relatively expensive process including the processing steps of cleaning, seeding or catalyzing the walls and then plating with the desired metal such as copper. Because of the relative expense associate with plating, alternatives have been suggested to provide electrical conductivity in unplated vias, whether through holes or blind vias. The alternative methods include providing solder paste filled blind vias, solder balls in blind vias, solder filled through holes, solder rings, and copper powder mixed into solder paste. Each of these methods depend on the solder bridging unplated/unsoldered prepreg. Traditionally, prepreg is not known for its solder wettability. In fact, unseeded prepreg is known to cause voids in plating within the vias. Unplated regions of prepreg are also known to give off moisture and process chemicals as the board or card is heated. This expulsion of vapors can form massive voids which disrupt electrical and thermal paths, often resulting in failure with time. The outgassing could also prevent the solder from settling to the bottom of a blind via. Visually the via may appear filled with solder, however, the via may merely be capped with solder, without forming a connection to the bottom metallic layer. This defeats the intent of the solder filled hole.

SUMMARY OF INVENTION

An object of the present invention is to provide electrical interconnection between metallic layers on different surfaces of a dielectric substrate that do not require plating of vias and do not suffer from the problems associated with solder in the vias.

According to the present invention, reliable and consistent interconnections are provided.

One aspect of the present invention is directed to a circuit board or circuit card containing a dielectric substrate having metallic layers on opposite major surfaces of the substrate. At least one via is provided that extends through the metallic layers and dielectric substrate. The at least one-via contains a solderable stud or eyelet containing solder on its outer surfaces to contact and secure the stud or eyelet to the walls of the at least one via to provide electrical interconnection between the metallic layers. The length of the stud or eyelet is less than the combined thickness of the dielectric substrate and metallic layers.

Another aspect of the present invention is directed to a circuit board or card containing a dielectric substrate containing metallic layers on opposite major surfaces of the substrate. At least one blind via is provided that extends through one of the metallic layers, the dielectric substrate and only partially through the other metallic layer. The blind via has a tapered lower portion which extends into the other metallic layer. The at least one blind via contains solder to provide electrical interconnection between the metallic layers.

The at least one blind via can be completely or partially filled with solder. The solder can be provided in the blind vias by screen printing. Also, walls of the at least one blind via can be plated, if desired, with a layer of electrically conductive metal.

A further aspect of the present invention is concerned with a method for electrically interconnecting metallic layers on opposite major surfaces of a dielectric substrate. The method includes providing on a major surface of a dielectric substrate, a first metallic layer and providing on another major surface of the dielectric substrate a second metallic layer. At least one blind via is formed by laser drilling through the first metallic layer and dielectric substrate. The metallic edges of the at least one blind via are subjected to the laser whereby the thickness of the first metallic layer is sufficient to permit melting and balling of the metallic edges to coat the walls of the at least one blind via with a metallic layer to electrically interconnect the metallic layers.

SUMMARY OF DRAWINGS

FIG. 3 is a schematic diagram of the embodiment of the present invention employing a tapered blind via partially filled with solder.

FIG. 4 is a schematic diagram of the embodiment of the present invention employing a tapered blind via having walls plated with a metallic layer.

BEST AND VARIOUS MODES FOR CARRYING OUT INVENTION

Figure 1:
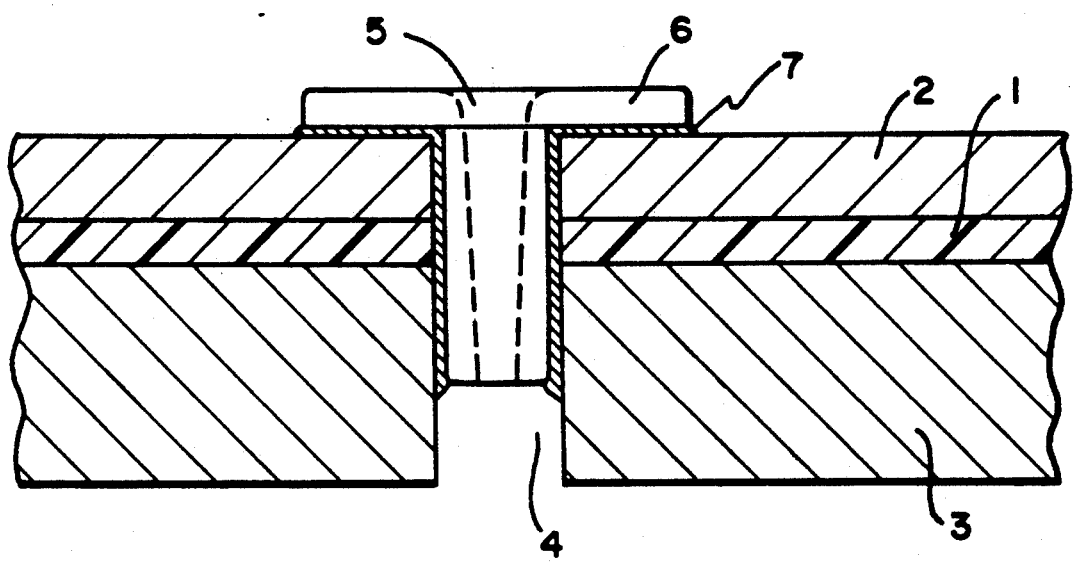
FIG. 1 is a schematic diagram of the embodiment of the present invention employing a solderable stud in a via.

The present invention is concerned with providing electrical interconnections between metallic layers on different or opposing surfaces of a dielectric substrate and especially for circuit boards and circuit cards, and most especially for power plane circuit cards.

A widely employed technique for preparing such is to impregnate a woven fiberglass sheet with a resin composition and then laminate a metallic layer such as a copper sheet to both sides of the resin impregnated fiberglass sheet. Next, an electrical circuit is etched into the copper on one side of the sheet. Electrical interconnection is then made between the circuit on the one side and the metallic layer on the opposite side of the sheet or dielectric substrate to supply current to the circuit from the opposite side.

Various resins have been suggested for the purpose of impregnating the fiberglass.

For example, epoxy resin laminated impregnated glass fabrics are widely used in the preparation of printed circuit boards and cards. In addition, other polymers can be used in place of the epoxy resin. Such polymers include halogenated polymeric materials such as polytetrafluoroethylene, and cyanate resins.

A number of epoxy-containing compositions have been suggested for such purposes and include those compositions disclosed in U.S. Pat. Nos. 3,523,037; 4,294,877; 4,294,743; and 4,550,128, disclosures of which are incorporated herein by reference.

In particular, epoxy compositions along the lines of the disclosure of U.S. Pat. No. 3,523,037 has been used in the preparation of power supply modules. Typically, power supply modules consist of a number of components surface mounted onto a circuitized card. The card consists of a thick copper plate (either 20 or 40 mil), a thin layer of the epoxy-fiberglass dielectric (one or two plies of prepreg), and typically three ounce copper circuitry.

More recently, an epoxy composition having increased thermal conductivity without a concomitant loss to any undesired extent in the other necessary properties for use in preparing printed circuit boards or cards has been disclosed in U.S. patent applications Ser. No. 07/294,090 filed Dec. 29, 1988 entitled, "Epoxy Composition of Increased Thermal Conductivity and Use Thereof" and Ser. No. 07/494,807 filed Mar. 14, 1990 entitled, "Epoxy Composition of Increased Thermal Conductivity and Use Thereof", both to Boyko, et al. and assigned to International Business Machines Corporation, the assignee of the present application; and disclosures of which are incorporated herein by reference.

In particular, the epoxy compositions employed therein and preferred for use in the present invention contain:

A) about 70 to 90 parts per 100 parts by weight of resin solids of a polyepoxide being tetrabrominated diglycidyl ether of a phenol;

B) about 10 to about 30 parts per 100 parts by weight of resin solids of an epoxy polymer having functionality of about 3.5 to about 6;

C) about 40 to about 75 parts by weight per 100 parts of resin solids of zinc oxide;

D) about 3 to about 4 parts per 100 parts by weight of resin solids of dicyandiamide;

E) about 0.2 to about 0.4 parts per 100 parts by weight of resin solvents of a tertiary amine.

The brominated epoxy polymers (i.e., tetrabrominated diglycidyl ether of a phenol) are known and commercially available.

Typically, the brominated epoxy polymers have an epoxy equivalent of about 455 to about 500. A more typical polyepoxide has a functionality of about 2, an epoxide equivalent weight about 455 to 500, and a bromine content of about 19% to 23% by weight. It is supplied by the Ciba-Geigy under the trade name Araldite 8011 as a solution containing 75% epoxy resin by weight in methyl ethyl ketone or by Dow Chemical Co. under the trade name DER-511 as an 80% solution in methyl ethyl ketone.

Examples of epoxy polymer having functionality of about 3.5 to about 6 are epoxidized phenolic novolak polymers.

The epoxidized novolak polymers are commercially available and can be prepared by known methods by the reaction of a thermoplastic phenolic aldehyde of a phenol with a halo-epoxy alkane.

A typical epoxidized novolak that can be employed is represented by the formula:

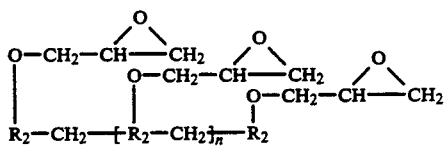

wherein n is at least about 1.5, wherein each $R_2$ individually is H or alkyl such as methyl or ethyl.

A specific example of an epoxidized novolak is a cresolformaldehyde novolak, available under the trade designation Araldite 1280 from Ciba-Geigy.

The zinc oxide powder employed can be present in any of the various particle shapes available, with the more typical shape being spherical.

In addition, the particle size of the zinc oxide can vary over a wide range. The zinc oxide particles employed typically have a particle size such that 100% passes through a 44 micron screen.

The zinc oxide can be employed in amounts of about 40 to about 75, more typically about 40 to about 60, and specifically about 50 parts by weight per 100 parts of resin solids.

Less preferably, fillers other than zinc oxide that provide thermal enhancement without total electrical conduction including non-conducting metal oxides and metal nitrides such as $Al_2O_3$, $TiO_2$, BN and AlN can be used in place of the zinc oxide.

Also included as a curing agent is dicyandiamide (cyanoquanidine). Such is usually employed in amounts of about 3 to about 4 parts per 100 parts by weight of the resin solids. It is conveniently incorporated into the composition as a solution in a suitable solvent such as ethylene glycol monomethyl ether.

The compositions also contain as a catalyst for the cure a tertiary amine. Suitable tertiary amines are benzyldimethylamine, α-methyl-benzyldimethylamine, dimethylaminomethylphenol, and tris (dimethylaminomethylphenol), with N,N,N',N'-tetramethyl-1,3-butane diamine being most typical.

The amine is usually employed in amounts of about 0.2 to about 0.4 and preferably about 0.3 parts per 100 parts by weight of the resin solids.

Solvents are desirably employed to achieve the desired consistency or viscosity for the compositions. Usually about 90 to about 100 parts by weight of solvent per 100 parts by weight of resin solids are employed. The amount of solvent is usually such that the composition without the zinc oxide has a specific gravity of 0.9 to 1.2.

Ethylene glycol monomethyl ether and methyl ethyl ketone serve as typical solvents. While ethylene glycol monomethyl ether and methyl ethyl ketone are the solvents of choice, other suitable solvents may also be used. For example, acetone or acetone and water may be used. Additionally, methyl ethyl ketone-dimethyl formamide can be used advantageously.

The epoxy compositions are used to impregnate woven glass fabric from which multilayer laminates, referred to as prepregs, are prepared. The prepreg is prepared using the type of equipment disclosed in U.S. Pat. No. 3,523,037, disclosure of which is incorporated herein by reference. The process with the above epoxy composition, however, employs temperatures of about 230° F. to about 300° F. to remove the solvents. The curing temperature after solvent removal is about 300° F. to about 350° F.

After this cure, which is to a partial or B stage, the now impregnated fabric or prepreg is divided into sheets of a desired size in preparation for lamination to form the printed circuit card or board. According to preferred aspects of the present invention, two sheets of prepreg, are employed. Because of the enhanced thermal conductivity of the laminate the ability to form thicker laminates with good conductivity is possible (e.g.—up to about 18 mils maximum) with a typical two prepreg sheets of a total post lamination thickness of about 4 to 6 mils being most often used.

After the prepreg is formed, one to five sheets are interweaved between sheets of electrolytic copper foil or other conductive material and placed between platens of a laminating press. The typical copper being about 0.5 to about 5-ounce with preferred copper being 3-ounce copper about 4 mils thick as the top layer and about 0.5 to about 50 ounce copper, typically about 28 ounce copper as the bottom layer.

The platens are cored for steam or super-heated water so that they can be heated to a temperature of 350° or more. The above assembly is subjected to pressure which may vary from 50 psi to 800 psi. The laminate is maintained at this temperature and pressure for a time sufficient to cause flow of the resin and completes the curing of the resin to a degree where it will provide properties desired in the laminate. Typical cure times vary from 30 minutes to 120 minutes at 340° F.

Then a circuit can be etched to the conductive layer using techniques well-known to form circuit boards.

Next, the electrical interconnections between the metallic layers on opposite sides of the dielectric substrate (e.g.—top and bottom) can be made pursuant to the present invention.

Reference to FIG. 1 will facilitate an understanding of the embodiment of the present invention employing a solderable stud in a via. In particular, numeral 1 represents the dielectric substrate (prepreg) such as of the type discussed above having a metallic layer 2 such as copper of about 0.5 to 5-ounce with about 3-ounce to about 2-ounce copper being more typical on the top surface thereof in a predetermined circuit pattern and a bottom layer of a relatively thick metallic material (3) such as copper of about a 28 ounce copper layer to provide a power plane integrated circuit card or board. A via (4) is provided through layers 1, 2 and 3. In the case of a through-hole the via extends all the way through the combined layers and in the case of a blind via the via stops short of extending through the entire thickness of metallic layer (3). A solderable metal stud (5) is placed within via (4) and extends through layer (2), substrate (1) and partially into layer (3). It is preferred that the stud (5) not protrude through the board or card because of subsequent assembly and reworking handling requirements. However, if the stud does protrude, the excess portion can be removed such as by cutting. In the case of a through hole via, the stud (5) includes flange portions (6) that extend on the top of metallic layer (2).

Instead of employing a stud, which is solid, an eyelet having a hollow portion such as within the vicinity of its center can be used. In fact, an eyelet in the case of a blind via is preferred since the hollow portion allows for the escape of gas during solder reflow.

The stud or eyelet can be precoated with a typical solder (7) such as a 63% tin-37% lead solder or a solder 54% Sn, 26% Pb, 20% In. In the alternative, solder can be screen printed into the via prior to placing the stud or eyelet therein. Next, solder joint is achieved during a solder reflow operation which can employ vapor phase, hot belt or infrared as examples. The studs (5) act as a bridge between the top side (2) and backside (3) current carrying metallic layer. The solder connection formed at each metallic layer makes both the electrical connection required and also provides for thermal dissipation. As noted from the configuration, the solder pursuant to the present invention is not required to either adhere to or bridge the unplated/unseeded prepreg as required in prior art techniques. The stud (5) acts as the bridge or capillary for the solder in the via.

In the case of a through-hole, if solder paste were present in the holes without the stud, upon reflow, at initial assembly and during rework operation a significant portion of the solder would run out the bottom of the through-hole thereby causing potential shorting problems and not assuring the formation of the necessary electrical and thermal connections.

Moreover, if desired, the stud or eyelet can be employed without the use of solder by using a press fit into the board. The press fit can be accomplished by placing the stud or eyelet into a preformed hole in the board or by nailing the stud or eyelet into the board. Moreover, if desired, the stud or eyelet can be ribbed or tapered to aid in achieving a press fit in a preformed hole.

The above technique provides for a reliable and cost effective means for achieving the necessary interconnections between the metallic layers (2) and (3). The stud or eyelet can be made of any conductive and malleable metal, metal mixture or alloy such as copper, nickel, gold, brass and phosphorous-bronze.

The material for the stud or eyelet is preferably solderable. The stud or eyelet is sized to fit the desired hole diameter which is generally about 10 mil to about 150 mil with about 43 mil being exemplary. When the stud or eyelet includes a flange portion, the breadth of such flange portion is generally at least about 2 mils greater than the diameter of the hole.

Figure 2:
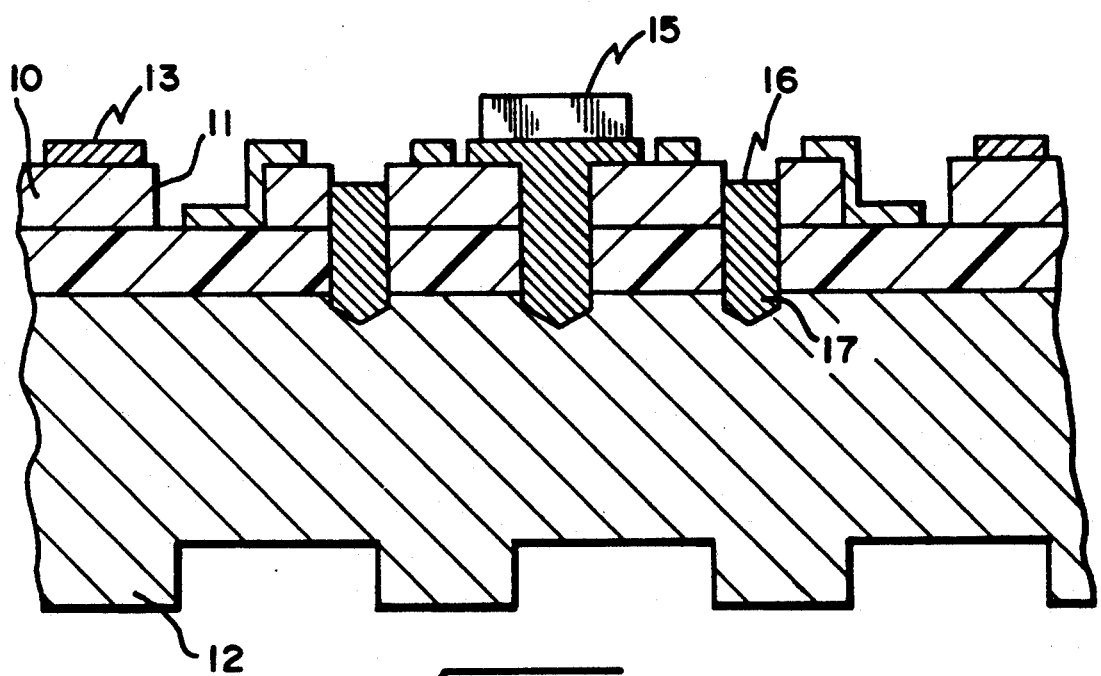
FIG. 2 is a schematic diagram of the embodiment of the present invention employing a tapered blind via filled with solder.

Reference to FIG. 2 facilitates an understanding of the embodiment of the present invention employing a tapered blind via containing solder. In particular, numeral 10 represents the dielectric substrate, numeral 11 represents the metallic circuitry on the top surface of the substrate which can include copper. Further electrical conductive layer of nickel or gold (13) can be provided on the copper circuitry and a chip (15) can be provided as shown. The chip (15) can be placed over a blind via and connected by solder into a blind via as shown in FIG. 1 if desired. Blind vias (16) having tapered portion (17) are provided through metallic layer (11), dielectric substrate (10) and partially through metallic layer (12). The angle of tapering of the vias is about 45° to about 180° and preferably about 130°. The entire tapered portion is preferably contained in metallic layer (12) to provide enhanced surface tension to the solder during solder reflow process since the bottom of the hole should be wettable by the solder. The tapered portion provides for greater surface area.

Solder paste is then provided by screen printing into the vias. Since the vias are preferably eccentric to the contact pads of the layer (12) the via will not be completely filled. Normally, the vias are drilled with a 10-150 mil drill bit, a specific example being a 0.05 inch drill bit, a little off center of the contact pad. The solder paste is then dried at usual temperatures of about 105° C. to about 130° C. and cause to reflow through vapor phase, infrared, hot belt or hot plate reflow processing.

FIG. 3 illustrates a modification of the embodiment of FIG. 2 whereby the screen printing of the blind vias with the solder occurs by employing offset screening process to fill the via except for portion represented by numeral 18 which remains unfilled due to the offset screening procedure. The offset screening facilitates outgasses and hot air to escape thereby assuring for the integrity and continuity of the solder connection. In fact, partially solder filled blind vias pursuant to this aspect of the present invention have successfully completed at least 2000 cycles of accelerated thermal cycling (−5° C. to 150° C.) (three life cycle). Typical holes include those about 15±2 mils deep to about 30±2 mils deep. A specific example being bout 21±2 mils deep, about 43 mils wide with about a 10 mil deep tapered portion.

Reference to FIG. 4 illustrates a further modification of the embodiment illustrated in FIG. 2 whereby vias are plated with a metal such as copper, aluminum or a precious metal such as gold, by well known plating techniques to provide a layer (20) on walls of the via. The plating provides a further assurance of the continuity of the electrical connections achieved pursuant to the present invention. However, in the case of plating with a metal, the hole within the vicinity of the bottom will be free from metal in order that the bottom, which is solder wettable, be exposed.

Figure 5:
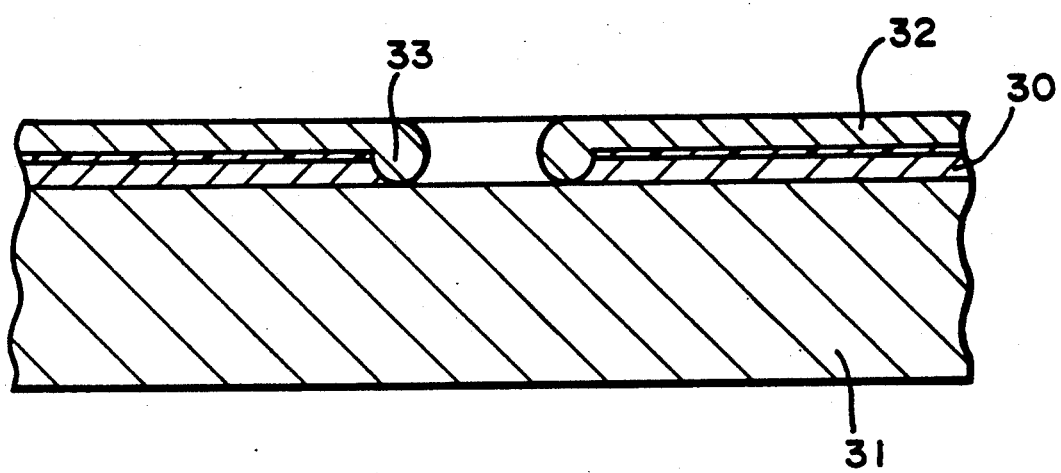
FIG. 5 is a schematic diagram of the embodiment of the present invention obtained by laser drilling.

Reference to FIG. 5 facilitates understanding of that aspect of the present invention employing laser drilling. In particular, a laminate is provided containing a dielectric substrate of the type discussed above (30) normally about 1 to about 10 mils thick laminated between a relatively thick or heavy metallic layer (31) such as 28 ounce copper and a layer (32) of metallic material such as about 1 to about 10 ounces of copper typically about 3 ounce copper. The thickness of layer (32) as will become apparent below must be sufficient that upon subsequent subjection to the laser will melt and ball up and in doing so coat the sides of the via previously formed by laser drilling. The desired circuitry is provided on the copper layer (32) by well known photolithographic techniques. Next, a window is etched through layer (32) and through dielectric substrate (30) where desired by laser. A typical laser being a yitrium aluminum garnet (YAG) laser. Typically, the energy of a YAG laser is about 2 joules/pulse operating at a 1.06μ fundamental frequency at a 10 nanosecond pulse, preferably a pulsed laser. Other lasers include neodymium-YAG and $CO_2$. According to preferred aspects of the present invention, YAG laser is used for drilling the via and $CO_2$ laser for melting the copper or metal. After the hole is etched through copper layer (32) and dielectric layer (30), the laser is then used to melt and ball the metal edges (33) of the holes which in turn will then coat the walls of the via including the walls adjacent the dielectric substrate. Next, solder can be provided in the holes to thereby insure complete interconnection between the layers (31) and (32).

The neodymium-YAG laser is preferably operated at a wavelength of 1.06 μm, and the $CO_2$ laser is preferably operated at a wavelength of 9.6 or 10.6 μm. The lasers are typically operated at a power range of 0.1 joules/cm$^2$ to about 2.0 joules/cm$^2$. When the laser is pulsed, such is typically carried out at about 30 picoseconds to about 10 nanoseconds. The particular power and pulse rate employed will depend upon the metal employed, its melting point and thickness as can be determined by persons skilled in the art without undue experimentation. The metal is to be melted and not vaporized. By way of example, a 30 picosecond pulse of 0.5 joules/cm$^2$ melts a total depth of copper of about 1000 angstroms.

Metals other than copper such as aluminum, gold, lead, tin, nickel and silver and combinations including lead-tin and lead-tin-indium alloys can be used, if desired.

Figure 6:
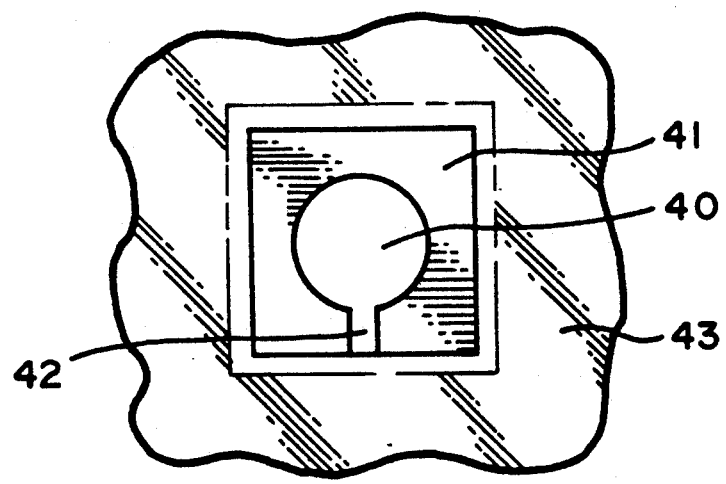
FIG. 6 is a top view of the embodiment of the present invention employing a blind via having a top land with "air-escape" for enhanced solderability.

FIG. 6 is a top view of an embodiment of the present invention wherein the top land has an "air-escape". In particular, numeral 40 represents the blind via located through copper landpad 41 through the underlying substrate (not shown). Cut-out portion 42 providing for escape of air during the solder fill process. Solder mask 43 is provided.

The following non-limiting examples are presented to further illustrate the present invention.

EXAMPLE 1

Through holes and blind vias are drilled into a composite having a copper layer of about 0.0042±0.004 inches thick on a dielectric epoxy prepreg of about 0.0052±0.0008 inches thick which in turn is present on thick copper substrate of about 0.04 inches thick. The sizes of the holes are as follows:

| Hole Number | Diameter (inches) | Depth (inches) | Type |
|---|---|---|---|
| 1 | 0.050 | .025 | blind |
| 2 | .050. | .047 | through |
| 3 | 0.050 | .017 | blind |
| 4 | 0.043 | .025 | blind |
| 5 | 0.043 | .017 | blind |

The bottom 0.010±0.002 inch portion of each of the blind vias is tapered at a 130° angle.

A 63/37 lead-tin solder paste is provided into the drilled holes through a solder stencil of about 0.010 inches thick.

Ribbed eyelets are press fitted into the solder paste filled holes as follows:

| Eyelet Sizes | | Corresponding Hole Number |
|---|---|---|
| Diameter (inches) | Depth (inches) | |
| 0.044 | 0.020 | 1 |
| 0.044 | 0.043 | 2 |
| 0.044 | 0.020 | 3 |
| 0.030 | 0.015 | 4 |
| 0.030 | 0.015 | 5 |

Each of the eyelets includes a flange at the upper end of about 0.063 inches.

The solder paste is then dried by heating at about 110° C.

The solder paste can be subjected to reflow when connection is required by exposure to infrared light.

EXAMPLE 2

Example 1 is repeated except that the holes are plated with a layer of about 0.0005 inches to 0.001 inches of copper by the process discussed below. The substrate is degreased by contacting with an alkaline cleaner followed by a spray rinse with water. Next, the substrate is microetched with sodium persulfate, following by spray rinse with $H_2O$ and acid dip with 25% HCl. The substrate is then sensitized/actuated with a composition containing about 50–60 grams/liter of $SnCl_2$ dihydrate, about 0.5 grams/liter of palladium chloride and about 200–300 ml/liter of 37% HCl followed by a deionized water spray rinse. A thin copper layer is provided from an electroless copper plating bath containing copper sulfate; EDTA, formaldehyde, KOH and KCN. The copper is then plated up to the desired thickness from an acid copper plating bath of $CuSO_4$, $H_2SO_2$, HCl and Scherring levelers and brighteners.

Upon reflow, 100% of the holes are filled with solder.

EXAMPLE 3

Through holes and blind vias are drilled as in example 1 and a solder stencil is placed in the drilled composite offset form normal with about 40% to about 50% of the holes on the composite being exposed to the solder paste. The apertures in the solder stencil are about 0.030 inches 0.054 inches to fill the 0.030 inch to 0.050 inch diameter holes. The solder paste is screened into the holes using a squeegee with the stencil opening of 0.054 inches oriented in the direction of the squeegee motion.

The solder paste is dried by heating at about 110° C.

The solder paste is caused to reflow by infrared, whereby, 100% partial hole fill is obtained. The partial hole fill varies from about 20–99% of the hole volume depending upon the specific hole is enhanced by reducing the effective copper land solderable surface size relative to the hole size by providing a non-solder wettable solder mask by curtain coating namely Probimer 601 from Ciba-Geigy. The coating is about 1 to about 2 mils thick. Prior to coating with the Probimer 601, the substrate is precleaned employing an alkaline degreaser such as HL-41 followed by a microetch with sodium persulfate and then contact with Entek. The Probimer 601 coating is exposed through a mask with a contact printer using ultraviolet radiation in the range of 365–435 nanometers at an energy level of 1000 millejoules. The pattern is developed by spraying with—butyrolactone for about 1.3 minutes. The coating is then baked in an oven at 85° C. employing a 4 minute rise, an 8 minute dwell time, and a 4 minute fall.

The copper land size for a hole of 0.043 inch diameter and 0.021 inch depth centered in the copper land contains a solder mask window 0.064 inch square centered on the center of the hole.

EXAMPLE 4

Example 3 is repeated except that the dull locations are offset from the central location of the land of about 0.010 inch.

The process results in about 35% of the holes being partially filled with solder after the reflow operation.

EXAMPLE 5

Example 1 is repeated except that 63/37 solder rings ranging from 0.040 inch to 0.050 inch diameter are used instead of the solder paste. The results obtained are similar to those of example 1.

EXAMPLE 6

Example 1 is repeated except that 63/37 solder balls are used instead of the solder paste. The solder balls are placed in the vias and tamped in place prior to reflow to prevent loss due to rolling out of the holes. The results are similar to those of example 1.

What is claimed is:

1. A circuit board or card having a dielectric substrate having metallic layers on opposite major surfaces of the substrate thereby providing said board or card with a topside and a bottomside at least one via extending entirely through one of said metallic layers and dielectric substrate and at least partially into the other of said metallic layers, wherein said at least one via contains a solderable member selected from the group consisting of stud having solder on the outer surfaces thereof and eyelet having solder on the outer surfaces thereof wherein said member contacts the walls of the said at least one via to provide electrical or thermal interconnection or both between the metallic layers on said topside and said bottomside and where the said member does not protrude through the combined thickness of the dielectric substrate and metallic layers and wherein said member has flange portions that extend on top of the metallic layer on that surface of the substrate through which said at least one via entirely extends.

2. The circuit board or card of claim 1 having a solderable stud.

3. The circuit board or card of claim 1 having a solderable eyelet.

4. The circuit board or card of claim 1 wherein said at least one via is a blind via.

5. The circuit board or card of claim 1 wherein said at least one via is a through hole.

6. The circuit board or card of claim 1 wherein said stud or eyelet is ribbed.

7. The circuit board or card of claim 1 wherein said stud or eyelet is tapered.

8. A method for electrically or thermally interconnecting metallic layers on opposite major surfaces of a dielectric substrate which comprises:
   providing on a major surface of a dielectric substrate, a first metallic layer and providing on another major surface of said dielectric substrate, a second metallic layer;
   selectively laser drilling at least one blind via through said first metallic layer and said dielectric substrate; and then subjecting the metallic edges of said at least one blind via to a laser whereby the thickness of the first metallic layer is sufficient to permit melting and balling of the metallic edges to coat the walls of said at least one blind via with a metallic layer to electrically interconnect said metallic layers.

9. The method of claim 8 wherein said first metallic layer is copper.

* * * * *